United States Patent [19]

Doiron, Jr.

[11] Patent Number: 4,534,832

[45] Date of Patent: Aug. 13, 1985

[54] ARRANGEMENT AND METHOD FOR CURRENT DENSITY CONTROL IN ELECTROPLATING

[75] Inventor: Laurea Doiron, Jr., Pelham, N.H.

[73] Assignee: Emtek, Inc., Haverhill, Mass.

[21] Appl. No.: 644,711

[22] Filed: Aug. 27, 1984

[51] Int. Cl.³ .................. C25D 5/02; C25D 21/10
[52] U.S. Cl. .................. 204/15; 204/273; 204/DIG. 7
[58] Field of Search ............ 204/15, 224 R, DIG. 7, 204/275, 273

[56] References Cited

U.S. PATENT DOCUMENTS

| | | | |
|---|---|---|---|
| 2,559,926 | 7/1951 | Beebe | 204/DIG. 7 |
| 3,743,583 | 7/1973 | Castonguay | 204/DIG. 7 |
| 3,809,642 | 5/1974 | Bond | 204/DIG. 7 |
| 3,962,047 | 6/1976 | Wagner | 204/15 |
| 4,304,641 | 12/1981 | Grandia | 204/DIG. 7 |
| 4,378,281 | 3/1983 | Scanlon | 204/224 R |
| 4,378,282 | 3/1983 | Martin | 204/224 R |

Primary Examiner—Thomas Tufariello
Attorney, Agent, or Firm—Pearson & Pearson

[57] ABSTRACT

A circuit board having a foil bonded to it and connected to serve as a cathode, faces an anode with an interposed shield of sections each of a plurality of horizontally disposed slats. The slats are uniformly spaced center to center, but upper sections of slats have a larger width in the vertical direction than slats of successively lower sections, so that the anode is more exposed in line-of-sight to the upper portions of the cathode foil than the lower sections. Therefore, in plating there is some compensation for the variation in voltage which occurs due to current flow from the upper connection of the cathode foil to the negative terminal. A sparger tube vertically oriented supports the slats. The tube is apertured between each slat and the apertures face the cathode. Electrolyte forced through the sparger tube and then through its openings serves to provide solution agitation for the cathode. Interposing the shield between the anode and the foil cathode so that relatively smaller spaces are provided to expose direct paths from anode to the parts of the cathode nearer the negative terminal and relatively larger in the direct paths from the anode to the parts more remote from the negative terminal, tend to compensate for voltage drop across the cathode due to current flow.

11 Claims, 3 Drawing Figures

ARRANGEMENT AND METHOD FOR CURRENT DENSITY CONTROL IN ELECTROPLATING

FIELD OF THE INVENTION

The invention relates to electroplating, and more particularly to an arrangement and method for electroplating circuit boards or the like.

BACKGROUND OF THE INVENTION

In the manufacture of circuit boards it is known to use electroplating to provide the circuits. In the process, a substrate has bonded to its surface a thin film or foil, usually of copper. Then by a photolithographic or other process, a non-conductive layer is formed on the copper film in a pattern which may be termed the negative of the electrical circuit to be formed on the substrate; that is, the openings in the non-conductive pattern leave exposed the copper foil in a pattern which is to be that of the conductive circuit. The areas covered by the non-conductive pattern are eventually the non-conductive part of the final board. After building up a layer of electroplated metal on the exposed foil, the non-conductive pattern is removed or dissolved, and the exposed copper underneath is etched away, leaving the layer of electroplated metal on what remains of the copper film.

The current tendency to increase the density and the complexity of electrical circuits generally requires finer lines and spacing on the circuit boards than before. In order to achieve finer lines, thinner foils are applied to the substrate, in order to reduce plating times and also to reduce the undesired effects of undercutting when the circuit is etched.

The use of thinner foils creates an undesired effect during the plating process. When a circuit board is clamped at the top to form an electrical connection, the thinner foil introduces a voltage drop across the foil from top to bottom, i.e. the bottom is more positive than the top which is connected to the negative terminal of the source. This diversity in voltage causes an increase in current density distribution, causing greater current density at the higher voltage portions of the foil, near the bottom. Variations in current density result in undesired variations in thickness of the current carrying final circuit plated elements. Excess plating is required at some parts to reach the minimum plating thickness called for overall. Uniformity is desirable for several reasons. For example, to use the shortest plating time consistent with providing the minimum acceptable thickness at any point in the circuit, to ease monitoring of plated thickness, and to reduce the use of plating metal.

Further, in plating circuit boards, one or more forms of agitation are employed to prevent metal ions from being depleted at the cathode surface. Mechanical motion of the cathode is one form, "mechanical agitation". Another is to place a sparger, a tube with holes perforated along the length, under the cathode. Air forced into and emerging from the sparger displaces and agitates the electrolyte and causes fresh electrolyte to come into contact with the cathode. This method is called "air agitation". A third method, "solution agitation" is to use a sparger and pump electrolyte, rather than air, into it and direct the flow from the sparger towards the cathode from openings in the sparger. "Solution agitation" also tends to improve the uniformity of plating and avoids the exhaustion of the electrolyte at the agitated portion of the cathode.

In U.S. Pat. No. 3,743,583 to Castonguay, 1973 for Printed Circuit Board Fabrication, is described a tunnel between anode and cathode intended to prevent diffusion in the bath, and thus to deposit slowly and uniformly on the printed circuit board.

The U.S. Pat. No. 3,809,642 to Bond, et al 1974 for Electroforming Apparatus Including An Anode Housing With A Perforate Area For Directing Ion Flow Towards The Cathode, describes an apparatus which uses a pair of telescoped tubes having apertures directed toward the cathode, for directing flow to obtain precise electrodeposition. Bond, et al thus describes solution agitation.

U.S. Pat. No. 3,962,047 to Wagner, 1976 for Method For Selectively Controlling Plating Thicknesses, discloses a shield for plating a greater thickness of metal on one side of a member than on the other side.

U.S. Pat. No. 4,304,641 to Grandia, et al 1981, discloses a rotary electro-plating cell in which the differential flow distribution of electrolyte, and thus a controlled current distribution is obtained by the difference in size and spacing of the nozzles.

SUMMARY OF THE INVENTION

According to the invention, in an arrangement for plating a circuit board, or the like, surfaced with a conductive foil, the masked surface of the board to be plated faces the anode, and a shield of non-conductive material between the board and the anode has sections of one or more slats, with spacing between slats of the sections varied to compensate for the voltage drop from one portion of the foil to another when in use as a cathode, the larger spacing being adjacent the foil portions more remote from the cathode connection. Further, in a preferred form, one or more electrolyte sparging tubes supports the sections, and directs a flow of electrolyte towards the cathode, the slats also guiding the electrolyte for solution agitation. A preferred form for each section is one or more slats, oriented horizontally, with greater spacing from bottom to top, and the variation in spacing being the result of variations in the thickness of the slats, which are themselves spaced center to center, but decreasing in vertical height from top to bottom.

In the method of the invention, in plating the board, the foil is connected to serve as a cathode, and there is interposed between the anode and the foil cathode a shield, preferably formed of sections of one or more horizontal slats, having relatively smaller spaces between slats in the direct paths from anode to the parts of the cathode nearer the negative terminal connection and larger spaces in the paths from anode to parts of the cathode more remote from the negative terminal to compensate for the voltage drop along the foil during plating. Further, a sparging flow of electrolyte is directed from between the slats toward the cathode for agitating the solution.

DESCRIPTION OF THE DRAWING

The various objects, advantages, and novel features of the invention will be more fully apparent from the following detailed description when read in connection with the accompanying drawing, in which like reference numerals refer to like parts and in which.

DETAILED DESCRIPTION

Figure 1:
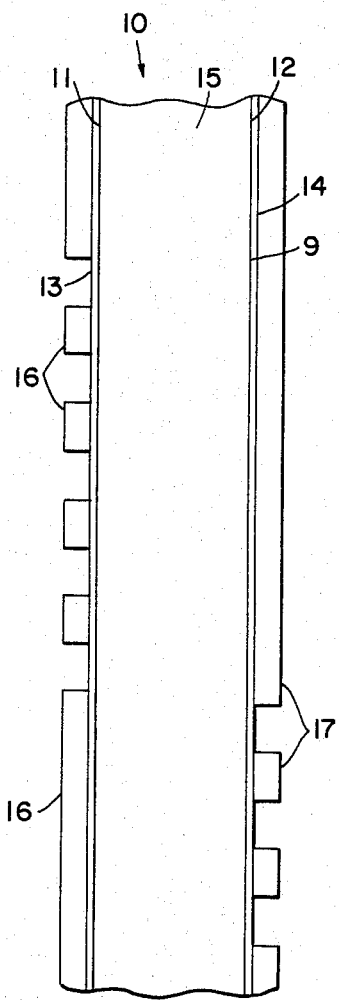
FIG. 1 is a greatly enlarged, side view, of a circuit board ready for electroplating.

Referring to FIG. 1, which is not to scale and is somewhat schematic, a circuit board 10 includes a substrate 9 with surfaces 11, at left, and 12, at right. The left side carries a foil layer 13 and the right side 12 carries a foil layer 14. The board is viewed at one edge 15. The mask 16 on left side 11, and the mask 17 on right side 12, each patterned, protects parts of the foils 13 and 14 respectively from plating. The masks 16 and 17 form a negative pattern for the final conductive circuit to be formed on the board 10.

Figure 2:
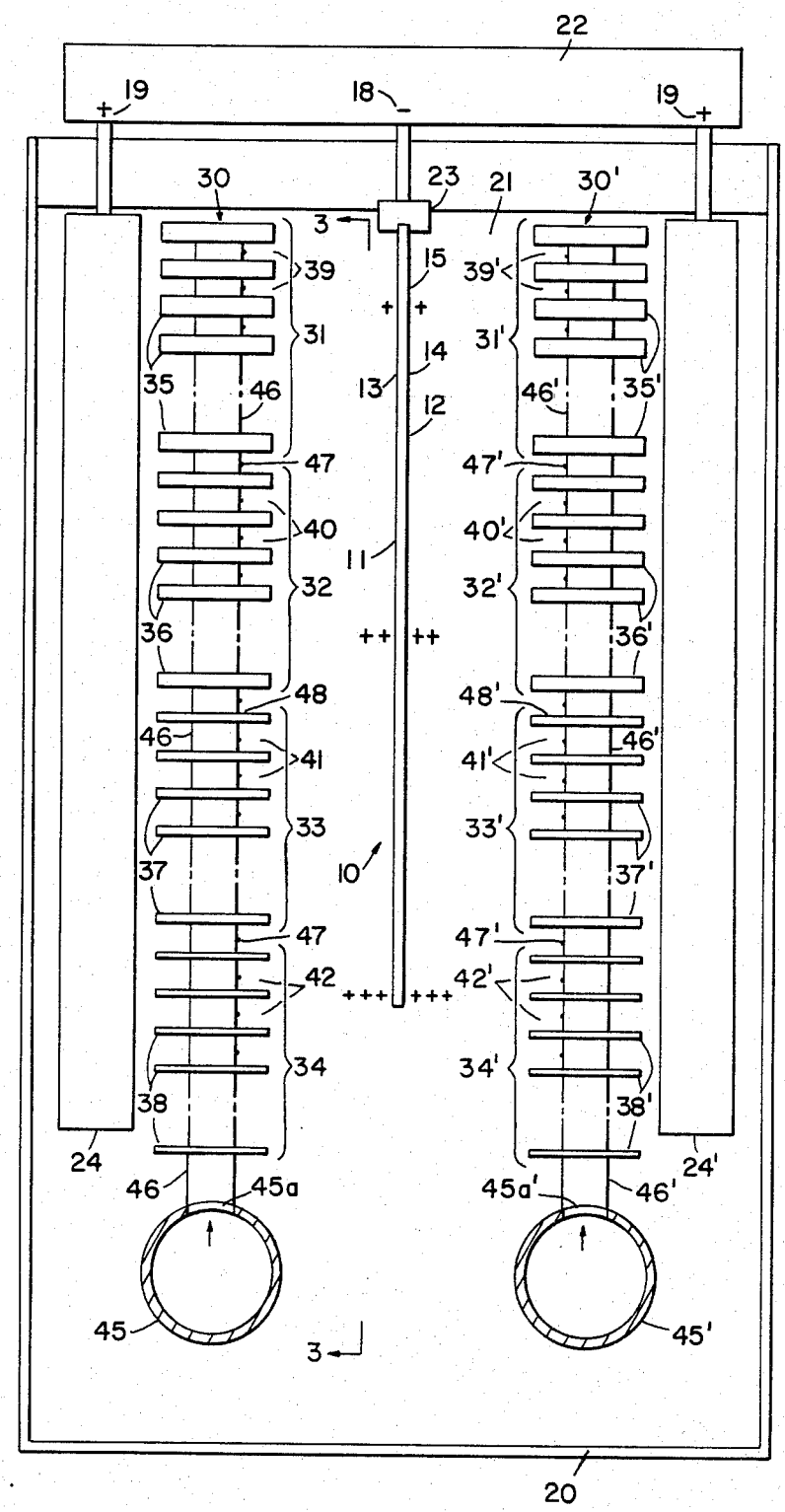
FIG. 2 is a side view of a plating arrangement embodying the invention.
Figure 3:
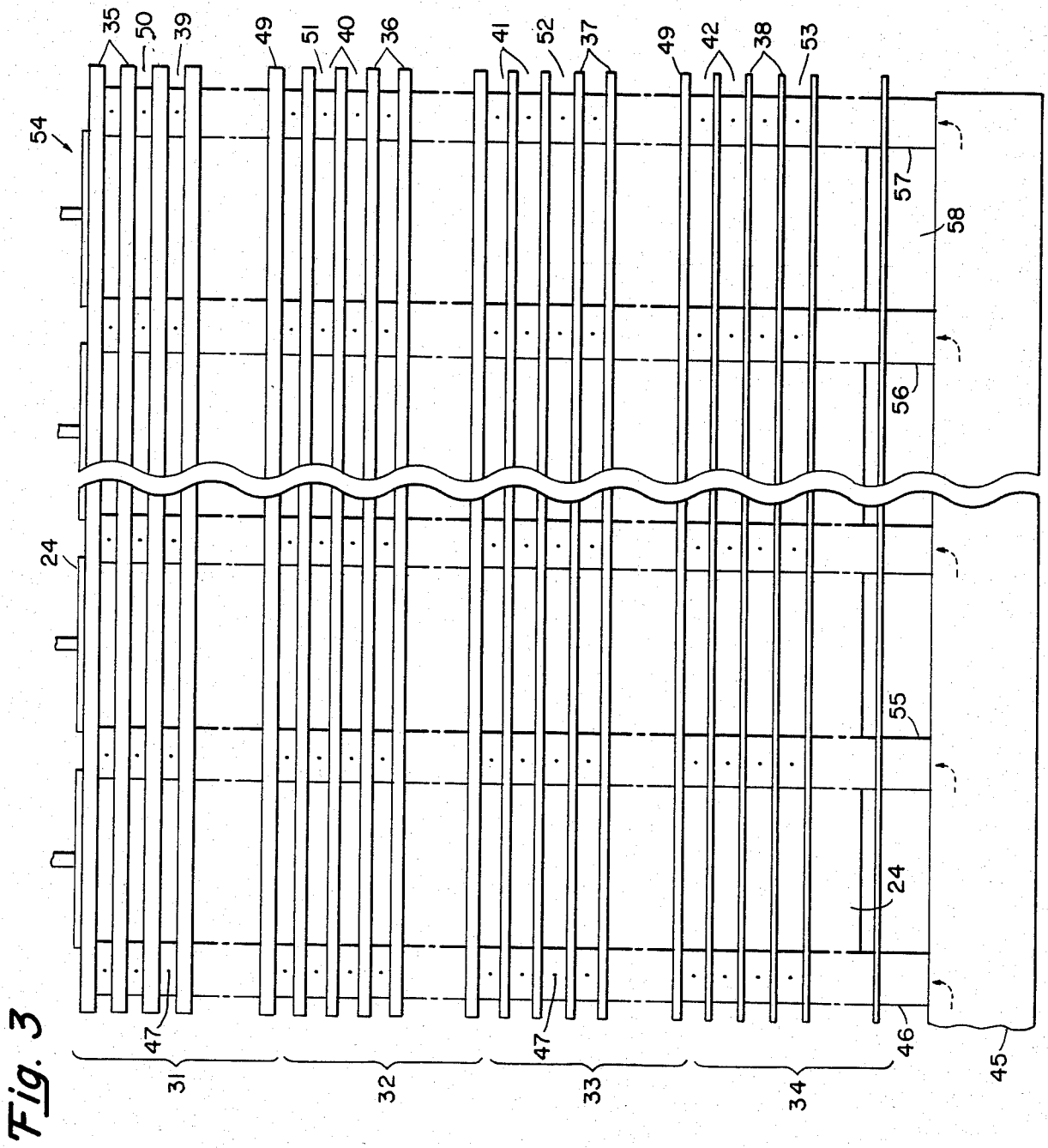
FIG. 3 is a view of the plating bath arrangement of FIG. 2 viewed along the lines 3—3.

Referring to FIGS. 2 and 3, the circuit board 10 is immersed in a suitable plating bath 21, of electrolyte in a container 20. The board 10 detail of the surface 11 to be plated, is not shown in FIG. 2. The foils 13 and 14 of the surfaces 11 and 12 are electrically connected at the top to the negative terminal 18 of a rectifier 22 or d.c. (direct current) source by being clamped to a connector 23. An anode 24 and an anode 24' immersed in the bath 21 are connected to the positive terminal, such as 19 of the rectifier 22, so as to present a suitable surface towards the board 10. Parts with primed reference numerals are duplicates on the right side of FIG. 2 of the parts described with unprimed reference numerals, and need no further description. Interposed between the anode 24 and the foil of surface 11, of the board 10 to be plated is a shield grid 30 having four sections 31, 32, 33, and 34 respectively extending from top toward bottom. The grid sections are formed of a succession of louvers or slats 35, 36, 37 and 38. The slats are horizontally disposed and rectangular in cross-section, affording parallel paths for the flow of electrolyte and virtually restricting the penetration of electrical fields to direct line of sight paths between the anode and the successive parts of the foil 13. The slats 35 of the first section are thicker than those 36 of the second section, which in turn are thicker than those 37 of the third section, which are thicker than those 38 of the fourth section. The slats are formed of non-conductive material such as PVC (polyvinylchloride). Because the slats for each section are respectively thicker than the succeeding section, the spaces between successive sections top to bottom 39, 40, 41 and 42 are successively increased, the spacing of the slats center to center remaining constant.

At the bottom of the bath 21 is a primary or supply sparger tube 45 which supplies sparger feed tube 46, the latter extending vertically and on which it is convenient to fasten or hang the slats 35, 36, 37, and 38, by any suitable means, not shown. The sparger tubes are also formed of non-conductive material. The supply sparger tube 45 feeds electrolyte through an opening 45a in the sparger feed tube 46, and thence through openings or apertures 47 into the bath to provide electrolyte agitation against the face of the surface 11 on which metal is being electrolytically deposited.

It is frequently desirable to plate both sides of a circuit board. In FIG. 1 a board has been shown with foil and pattern on both sides, implicitly assuming that plating will occur on both sides. Accordingly, in FIG. 2, the parts referenced with prime numbers provide a corresponding arrangement for the deposition of metal on the surface 12 as that described for deposition on the surface 11.

When plating is in progress, the rectifier is turned on and the electrolyte is circulated through tubes 45 and 45' to the sparger feed tubes 46 and 46', by any suitable pump means. A voltage drop occurs between the upper part of the foil because of the current flow and the thinness of the foil, which introduces a resistance to the flow of current. This voltage drop creates a voltage difference indicated by the + signs near the bottom of the board, and a fewer number of plus signs near the center and only a single plus sign near the top.

Due to the voltage drop, the foil is increasingly positive with depth or distance from the negative terminal, and has a voltage level essentially corresponding to the negative terminal of the rectifier only at the connection to terminal 23.

The increase in spacings from top to bottom 39, 40, 41 and 42 tends to compensate for the voltage drop by increasing the direct line exposure of the cathode foil 13 to the face of the anode 24 (and similarly on the cathode foil 14 to the face of the anode 24'). This increased exposure permits a greater field and, therefore, tends to increase the current density of the plating ions at the foil 13, thereby compensating for the lower differential in voltage between foil 13 and anode 24 with increased depth of the bath or distance from the connection 23.

Preferably, the center to center spacing of the slats is kept constant and the vertical width of the slats is decreased with depth in the bath, to afford a greater total exposure, and therefore, a greater speed of plating than if the slats were of like vertical width throughout and spaced farther apart at the lower portion of the bath.

The passageways 50, 51, 52, and 53 formed between the slats, being directed directly across from anode to the foil 13 cathode tends to restrict the fields between direct facing portions of anode and cathode. Further, these passageways also tend to guide the electrolyte from the openings 47 directly toward the cathode to improve the uniformity of solution agitation.

Preferably, a series of slats for each section of like size are employed, for practical reasons, since several slats for each section appears in general to provide the variation desired to compensate for the voltage differential created by current flow in the foil, and such uniformity for each section makes it easier to manufacture the arrangement and easier to obtain supply of the slats. Nevertheless, the slats could be individually dimensioned in the vertical direction, or uniformly so dimensioned and variably spaced, as heretofore noted.

Using the method and arrangement of the invention greater uniformity of plating is achieved.

The current density of the plating at the upper portions of the board tends to be similar to that at the lower portions of the board because of the compensation afforded by variation in exposure to the anode of the cathode foil, increasing at the lower portions where a greater current density is desired to compensate for the decrease in voltage difference.

The grid means 54 of the invention not only consists of the plurality of generally horizontal, spaced apart slats, or louvers, such as 35, 36, 37 and 38, each of non-conductive material and of predetermined thickness and spacing and mounted on the sparger tubes such as 46, in the spaces 48, between the jet apertures 47 of the tubes, but may also include the row 49 of generally vertical sparger tubes such as 46, 55, 56, and 57, each tube being spaced as at 58, from adjacent tubes and being of predetermined diameter.

I claim:

1. In an arrangement for plating a circuit board or the like, the board having a surface to be plated and on the surface a vertically disposed conductive foil having a connection to serve as a cathode, the foil being masked by a non-conductive layer leaving the foil exposed in a pattern to be plated:

an anode; and a shield of non-conductive material between the board and the anode and having sections with spacing between the non-conductive material of a section varied vertically to compensate for the voltage drop from one portion of the foil to another when in use as a cathode.

2. An arrangement as claimed in claim 1, said connection being at the top; said shield sections each comprising one or more horizontal non-conductive slats, said spacing being the spacing between slats, which increases with increasing vertical distance from the connection.

3. An arrangement as claimed in claim 2, further comprising a sparger supply tube vertically oriented on which the slats are supported between tube and foil, the sparger tube having apertures between adjacent slats, the apertures facing the foil cathode.

4. A method of plating a circuit board or the like, the board having a surface to be plated and on the surface a conductive foil masked by a non-conductive layer leaving the foil exposed in a pattern to be plated, the steps comprising:

connecting the foil to the negative terminal of a d.c. source of voltage to serve as a cathode;

connecting an anode to the positive terminal of the source;

interposing between the anode and the foil cathode a non-conductive shield having spaces relatively smaller in the direct paths from anode to the parts of the cathode nearer the negative terminal connection and relatively larger in the direct paths from the anode to the parts of the cathode more remote from the negative terminal connection to compensate for the voltage drop along the foil during plating; and immersing the anode, cathode, and shield in electrolyte.

5. A method as claimed in claim 4, the non-conductive shield comprising slats affording passageways: restricting direct line of sight between anode and cathode through the passageways.

6. A method as claimed in claim 5, further comprising guiding electrolyte between the passageways and directed to the cathode to provide solution agitation.

7. A method as claimed in claim 6, comprising the further step of suspending the slats from a sparger tube which supplies the electrolyte guided between the passageways.

8. Apparatus for controlling current density distribution in the plating of a printed circuit board said apparatus comprising:

a container of electrolyte;

a rectifier, mounted above said container and having said board depending down from the negative terminal thereof into said container to form a cathode in said electrolyte;

an anode depending down from a positive terminal of said rectifier into said container and electrolyte at a spaced distance from said anode;

a sparger tube extending vertically within said container in the space between said anode and said cathode for solution agitation of said electrolyte; and grid means, of non-conductive material mounted in the space between said anode and cathode for limiting the anode area in direct line of sight to isolated circuits on the cathode by creating a longer conduction path through the electrolyte to reach such isolated circuits on the cathode.

9. Apparatus as specified in claim 8 wherein:

said grid means is a plurality of generally horizontal spaced apart slats, of predetermined thickness and spacing.

10. Apparatus as specified in claim 8 wherein:

said grid means is a plurality of generally horizontal, spaced apart slats, each of predetermined thickness and spacing apart and each mounted on said sparger tube in a space between the jet apertures of said sparger tube.

11. Apparatus as specified in claim 8 wherein:

said grid means includes a plurality of said sparger tubes each at a spaced distance apart and each extending vertically in said container and includes a plurality of generally horizontal slats of predetermined thickness and spacing, mounted on said sparger tubes.

* * * * *